United States Patent
Usui

(10) Patent No.: US 6,518,813 B1
(45) Date of Patent: Feb. 11, 2003

(54) CLOCK GENERATING CIRCUIT AND SEMICONDUCTOR INTEGRATED CIRCUIT USING THE SAME

(75) Inventor: Toshimasa Usui, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/647,160

(22) PCT Filed: Jan. 28, 2000

(86) PCT No.: PCT/JP00/00473
§ 371 (c)(1),
(2), (4) Date: Oct. 19, 2000

(87) PCT Pub. No.: WO00/45246
PCT Pub. Date: Aug. 3, 2000

(30) Foreign Application Priority Data

Jan. 29, 1999 (JP) .................. 11-023294

(51) Int. Cl.[7] .................. H03K 3/00
(52) U.S. Cl. .................. 327/291; 327/299
(58) Field of Search .................. 327/41, 161, 173, 327/174, 175, 176, 271, 291, 292, 293, 294, 295, 296, 299, 99; 375/373, 375

(56) References Cited

U.S. PATENT DOCUMENTS

| | | | |
|---|---|---|---|
| 5,228,042 A | * 7/1993 | Gauthier et al. | 371/20.5 |
| 5,457,546 A | * 10/1995 | Hong | 358/447 |
| 5,559,645 A | * 9/1996 | Miyazawa et al. | 360/51 |
| 5,682,114 A | * 10/1997 | Ohta | 327/176 |
| 5,699,005 A | 12/1997 | Menkhoff et al. | 327/292 |
| 6,020,773 A | * 2/2000 | Kan et al. | 327/271 |
| 6,044,122 A | * 3/2000 | Ellersick et al. | 327/161 |
| 6,064,707 A | * 5/2000 | Woodman, Jr. | 375/373 |
| 6,094,080 A | * 7/2000 | Jeong et al. | 327/291 |
| 6,141,278 A | * 10/2000 | Nagase | 365/222 |
| 6,178,146 B1 | * 1/2001 | Hogan | 369/47 |
| 6,194,918 B1 | * 2/2001 | Franson et al. | 327/41 |

FOREIGN PATENT DOCUMENTS

| | | |
|---|---|---|
| JP | 5-152908 | 6/1993 |
| JP | 9-1018935 | 4/1997 |
| JP | 9-146655 | 6/1997 |
| JP | 11-15550 | 1/1999 |
| TW | 86105630 | 12/1996 |

* cited by examiner

Primary Examiner—Timothy P. Callahan
Assistant Examiner—Linh Nguyen
(74) Attorney, Agent, or Firm—Oliff & Berridge PLC

(57) ABSTRACT

A clock generating circuit 10, for generating a clock signal of which frequency is variable, has a delay circuit 20, a selector 30 and a control circuit 40. The delay circuit 20 has buffers 21 to 24 for delaying the input clock signal and output terminals 30A to 30D each of which outputs a clock signal delayed by a different delay time. The selector 30 selects one of the output terminals in the delay circuit 20, based on the output from the control circuit 40. The control circuit 40 supplies an output signal formed of a group of bits that is circulated in a predetermined cycle, to the selector 30. A cycle in an output clock signals OUT sequentially outputted from the output terminal 12 through the output terminals selected by the selector 30 increases or decreases in accordance with the group of bits in the output signal. Thus, the frequency in the output clock signal OUT will vary to reduce EMI noise.

17 Claims, 14 Drawing Sheets

CLOCK GENERATING CIRCUIT AND SEMICONDUCTOR INTEGRATED CIRCUIT USING THE SAME

FIELD OF THE INVENTION

The present invention relates to a clock generating circuit for generating a clock signal capable of reducing EMI noise and a semiconductor integrated circuit using the clock generating circuit.

DESCRIPTION OF THE PRIOR ART

Recently, the operational speed in semiconductor integrated circuits is greatly increasing with progress of the semiconductor manufacturing process. Thus, the operational speed, for example, of the output buffer within the semiconductor integrated circuit is also highly increasing. For example, a recent SDRAM may operate at a speed equal to or higher than 100 MHz and thus the data bus will also be operated with a frequency equal to or higher than 100 MHz.

Such a high-speed data bus tends to produce increased noise due to the electromagnetic wave emitted from the printed circuit board. Various standards limiting such emitted electromagnetic wave noise have been established. Accordingly, the emitted electromagnetic wave noise shall not exceed the upper limit of noise level which is established for each frequency band.

The electromagnetic wave noise emitted from electronic instruments is generally known as "EMI noise" or simply "EMI".

FIG. 18 exemplifies an EMI noise spectrum obtained by measuring EMI noises from an electronic instrument for each frequency. In this figure, the horizontal axis represents the frequency while the vertical axis depicts the noise level (or electromagnetic wave intensity).

Since the general digital electronic instruments operate with a clock signal of constant basic frequency, their output waveforms are of rectangular shape synchronizing with the clock signal. The rectangular wave contains high harmonic components integral times the basic frequency. Thus, EMI noise will have peaks at primary, secondary and other high harmonic frequencies in addition to the basic wave.

Since clock signals used in the present electronic instruments are particularly generated by crystal oscillators, the stability in frequency is very high. Thus, EMI noise generated will also have increased peaks.

In this connection, to meet the EMI noise standards, it is required that the peak level in the EMI noise for each frequency band is reduced. Various measures have been made to reduce the peak in EMI noise. One of such measures is a method called "Spread Spectrum". This method is to intentionally vary the frequency of clock signal to spread the distribution of frequency.

Usually, PLL is used to perform this spread spectrum method. However, PLL is not suitable for mounting on the semiconductor integrated circuits since it includes analog circuits such as VCO and the like.

It is therefore an object of the present invention to provide a clock generating circuit which can reduce EMI noise by generating a clock signal having its frequency that can be varied at a digital circuit, and a semiconductor integrated circuit using such a clock generating circuit.

DISCLOSURE OF INVENTION

In accordance with one aspect of the present invention, it provides a clock generating circuit comprising:

a delay circuit having output terminals, the delay circuit delaying an input clock signal and outputting delayed clock signals of different delay times respectively;

a selector selecting one of the output terminals; and a control circuit controlling a selection operation in the selector, wherein the control circuit supplies a group of bit output signals circulated in a predetermined cycle to the selector, and wherein a cycle of an output clock signal sequentially outputted from each of the output terminals selected by the selector increases or decreases in accordance with the group of the bit output signals.

According to this aspect of the present invention, the clock signals of different delay times are sequentially output from the output terminals in the delay circuit, in accordance with the group of bit output signals circulated in a predetermined cycle. Thus, the cycle of output clock signals is increased or decreased to vary the frequencies in the output clock signals. The output clock signals are generated by the digital circuit and can yet be used to reduce the EMI noise.

The control circuit may include a counter circuit counting a given signal. In such a case, the control circuit may supply a bit output signal to the selector, the bit output signal selecting one of the output terminals that increases or decreases the delay time based on a count value from the counter circuit.

The selector may alternately select one of the output terminals providing minimum delay time and another of the output terminals based on the bit output signal. Thus, the cycle of output clock signals will alternately be increased and decreased.

The counter circuit may count one of the output clock signals having maximum delay time among the output clock signals outputted through the output terminals. Thus, the timing for switching the output terminals in the delay circuit will be synchronized with the output clock signals of maximum delay time. In such a manner, no hazard or spike will occur in the output clock signals.

The control circuit may include a linear feedback sift register having a bit output at least (N+1) where N is a number of bits in the bit output signal supplied to the selector. By supplying an output signal of N bits from the linear feedback sift register to the selector, that output signal of N bits may occur in the form of a pseudo-random number. Even though the output clock signal is divided for using as transfer clocks or the like, EMI noise can be reduced since the frequency in the divided clock signal varies at all times.

The clock generating circuit may comprise a logic gate into which a delayed clock signal from the one of the output terminals selected by the selector and the input clock signal are inputted to generate an output clock signal having an edge of which position is equal to a position of an edge of the input clock signal.

Although a hazard or spike occurs on switching between the output terminals in the delay circuit, the waveform causing the hazard or spike can be removed when the signal passes through the logic gate. In such a case, therefore, the counter circuit may count the input clock signal.

A buffer may be connected to each of front stage of the output terminals of the delay circuit and each buffer is connected to a load different from another. Thus, the difference between the delay times of the output clock signals from the output terminals will be shorter than the delay time difference obtained only by the buffer.

The delay circuit may comprise first and second delay circuits connected in series. In such a case, the first delay circuit may have first output terminals each of which outputs a first clock signal being delayed by a different delay time that is a multiple of a first delay time. The second delay circuit may have second output terminals further delaying the first clock signal outputted from any one of the first output terminals in the first delay circuit by a different delay time that is a multiple of a second delay time shorter than the first delay time, and outputting a second clock signal.

Thus, by selecting either of the first output terminals in the first delay circuit, a larger difference of delay time can be selected. On the other hand, by selecting either of the second output terminals in the second delay time, a smaller difference of delay time can be selected. As a result, an output clock signal having a sum delay time obtained by adding the larger and smaller delay times together can be generated.

M (M≧2) number of buffers may be connected in series to a front stage of each of the first output terminals in the first delay circuit, and at least one of buffer equal to or less then (M−1) number may be connected to a front stage of each of the second output terminals in the second delay circuit.

The clock generating circuit may further comprise a third delay circuit which is connected in series to the second delay circuit. The third delay circuit may have third output terminals, each of which further delays the second clock signal outputted from any one of the second output terminals in the second delay circuit by a different delay time that is a multiple of a third delay time shorter than the second delay time, and outputs a third clock signal.

By thus combining three types of delay times respectively selected at the first, second and third delay circuits, the number of types in delay time differences can be increased and also each of the delay time differences can more finely be set.

Each of a front stage of the third output terminals may be connected to a load different from another. Thus, the delay time differences can more finely be set since the minimum delay time difference in the second delay circuit depends on the delay time provided by the buffer while the minimum delay time difference in the second delay circuit depends on the time difference provided by the load.

The control circuit may comprise a timer circuit which sets a cycle of frequency in the output clock signal until the output clock signal gradually increases and decreases. When the set value in this timer circuit is varied, the cycle of frequency in the output clock signal until it gradually increases and decreases can be varied.

The control circuit may comprise:

an addition/subtraction circuit obtaining a bit output signal which gradually increases or decreases a frequency of the output clock signal; and an addition/subtraction switching circuit switching between addition and subtraction in the addition/subtraction circuit.

When the addition/subtraction circuit is switched to the addition mode by the addition/subtraction switching circuit, the addition/subtraction circuit performs the addition to gradually increase the frequency of the output clock signal. On the contrary, when the addition/subtraction circuit is switched to the subtraction mode by the addition/subtraction switching circuit, the addition/subtraction circuit performs the subtraction to gradually decrease the frequency of the output clock signal.

The clock generating circuit may further comprise a phase comparison circuit which compares a phases difference between the input clock signal and the output clock signal. The phase comparison circuit may output a switching signal to the addition/subtraction circuit when the phase difference exceeds a specified value. Thus, the phase difference between the input and output clock signals is maintained within a constant range. This enables output clock signal of variable frequency to be generated without need of any huge memory capacity.

In accordance with another aspect of the present invention, it provides a semiconductor integrated circuit comprising the clock generating circuits having any one of the configurations as mentioned above. The clock generating circuit included in this semiconductor integrated circuit may generate a clock to be inputted to a logic circuit. However, it is preferable that a clock generated by the clock generating circuit is used as a transfer clock signal in an output circuit which outputs a signal from the logic circuit to outside. Since the frequency of a signal outputted from the output circuit and then transmitted through the wiring of a printed circuit board is variable, EMI noise emitted from the wiring of the printed circuit board can be reduced.

BEST MODE FOR CARRYING OUT THE INVENTION

Several embodiments of the present invention will now be described with respect to the drawings.

First Embodiment

Figure 1:
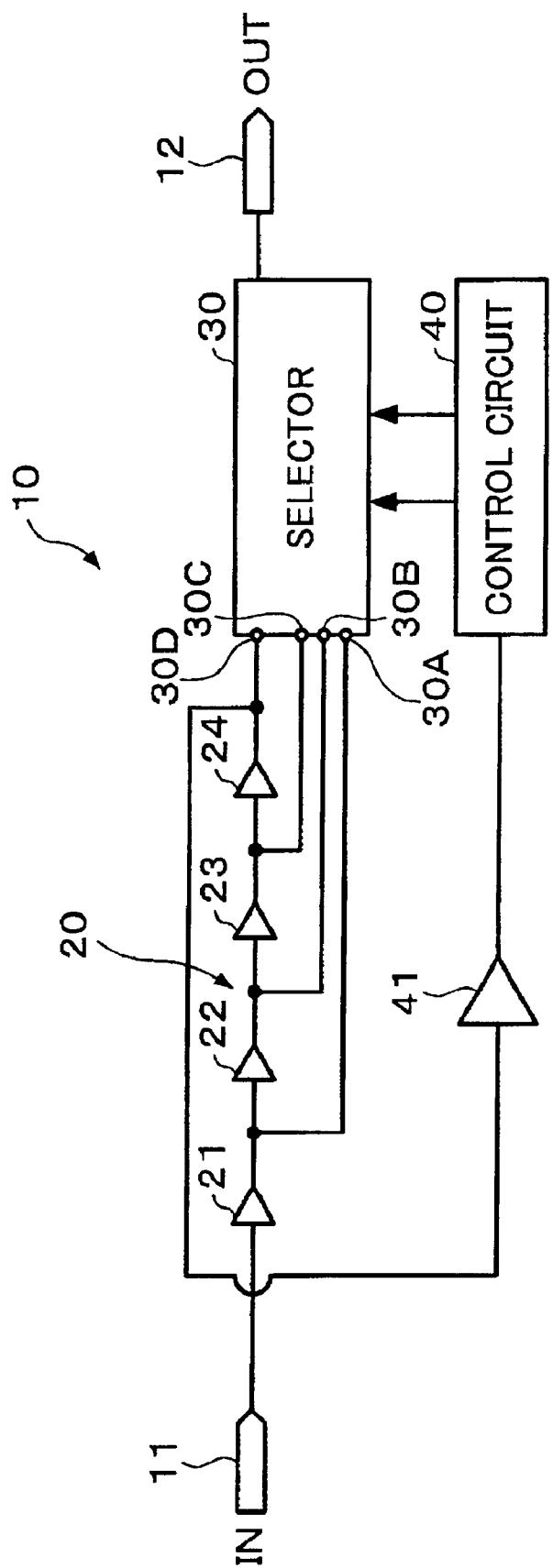
FIG. 1 is a block diagram of a clock generating circuit according to a first embodiment of the present invention.

FIG. 1 is a block diagram showing a first embodiment of the present invention that performs a principle operation of the present invention.

Referring to FIG. 1, there is shown a clock generating circuit 10 which comprises an input terminal 11 for receiving an input clock signal of constant frequency and an output terminal 12 for outputting an output clock signal obtained by changing the frequency of the input clock signal.

The input clock signal is inputted through the input terminal 11 into a delay circuit 20 having buffers 21 to 24. Clock signals delayed by the buffers 21 to 24 in the delay circuit 20 are then inputted into a selector 30. To select any one of the delayed clock signals through the buffers 21 to 24, the selector 30 selects one of tap terminals 30A to 30D and causes a clock signal from the selected tap terminal to output through the output terminal 12.

A control circuit 40 is provided which controls the selection in the selector circuit 30. The control circuit 40 receives the output of the final-stage buffer 24 through a buffer 41. The buffer 41 causes a clock signal from the final-stage buffer 24 to delay by the same delay time as in the selector 30. Based on the signal from this buffer 41, the control circuit 40 outputs a two-bit signal for controlling the selection of one of the four tap terminals 30A to 30D in the selector 30.

It is now assumed herein that the delay time in each of the buffers 21 to 24 forming the delay circuit 20 is 0.1 ns while the delay time in each of the selector 30 and buffer 41 is 0.9 ns. It is further assumed herein that one cycle of a clock signal inputted into the input terminal 11 is 15.0 ns.

Figure 2:
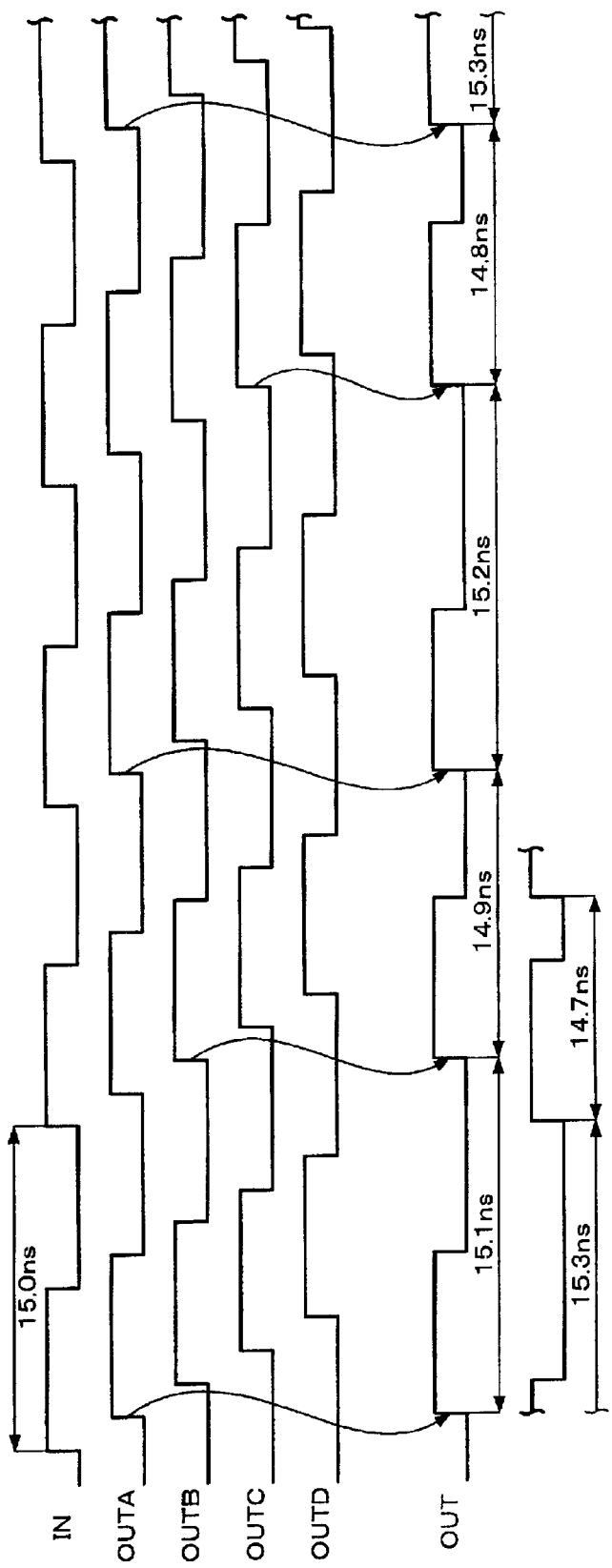
FIG. 2 is a timing chart illustrating the operation of the clock generating circuit shown in FIG. 1.

Four types of clock signals outputted from the buffers 21 to 24 through the output terminal 12 in such a setting are shown in FIG. 2. The rising of a output clock signal OUTA when the tap terminal 30A of FIG. 1 is selected is delayed by 1.0 ns (=0.1+0.9) with respect to the rising of an input clock signal IN. Similarly, output clock signals OUTB to OUTD passed through the tap terminals 30B to 30D are respectively delayed by 1.1 ns, 1.2 ns and 1.3 ns with respect to the input clock signal IN. It is to be noted that FIG. 2 exaggeratedly shows the delays of the respective output clock signals OUTA to OUTD with respect to one cycle of the input clock signal IN.

The final output clock signal OUT shown in FIG. 2 exemplifies a waveform obtained by sequentially selecting one of the output clock signals OUTA to OUTD. In other words, the final output clock signal OUT shown in FIG. 2 is obtained by selecting the output clock signals in the order of OUTA→OUTB→OUTA→OUTC→OUTA→OUTD as described. If such a switching is represented in terms of the selected delay times (or selected tap terminals), such an order may be 1.0 ns (30A)→1.1 ns (30B)→1.0 ns (30A)→1.2 ns (30C)→1.0 ns (30A)→1.3 ns (30D)

When such a procedure is repeated, the control circuit 40 will alternately control to select the minimum delay time (1.0 ns) or the other delay times (1.1 ns, 1.2 ns and 1.3 ns) The control circuit 40 may be constructed by a combination of a register for storing the signal selecting the minimum delay time with an up-counter.

In such an arrangement, time from a rise in the final output clock signal OUT to the next rise (or one cycle) will vary to be 15.1 ns→14.9 ns→15.2 ns→14.8 ns→15.3 ns→14.7 ns, as shown in FIG. 2.

Thus, one cycle of the input clock signal IN is maintained constant at 15.0 ns while one cycle of the final output clock signal OUT varies through six kinds of 14.7 ns to 15.3 ns. Therefore, the clock frequency will vary through six kinds in the range between 3 MHz (1/15.3 ns) and 68.02 MHz (1/14.7 ns)

When such a final output clock signal OUT is used, the peak in EMI noise will be distributed through six peaks in the range between 65.3 and 68.02 MHz. Therefore, the peak noise will be reduced to one-sixth.

It is to be understood that the final output clock signal OUT shown in FIG. 2 is only an example. For example, when a register for storing a signal selecting the minimum delay time and a down-counter are used as the control circuit 40, one cycle in the final output clock signal OUT may be varied through the order of 15.3 ns→14.7 ns→15.2 ns→14.8 ns→15.1 ns→14.9 ns as described. Alternatively, the down-counter may be replaced by up-counter and down-counter which are different in cycle from each other. In such a case, one cycle in the final output clock signal OUT may be varied in the order of 15.1 ns→14.9 ns→15.2 ns→14.8 ns→15.3 ns→14.7 ns→15.2 ns→14.8 ns→15.1 ns→14.9 ns as described.

It will now be described that the control circuit 40 receives a clock signal from the final-stage buffer 24 through the buffer 41 in which the same delay time as in the selector 30 has been set. A signal outputted from the buffer 41 is the same as the output clock signal OUTD of FIG. 2.

In synchronization with the fall in the output clock signal OUTD, the control circuit 40 controls the selection in the selector 30. Thus, the selector 30 can select any of the next output clock signals OUTA to OUTD after all the previous output clock signals OUTA to OUTD have risen.

Figure 3:
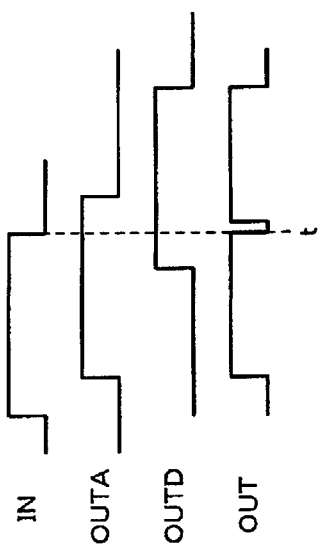
FIG. 3 is a timing chart illustrating the operation of the clock generating circuit in which a hazard occurs in the final output signal when a timing of selection is neglected.

When such a timing of selection is neglected, a bad effect as shown in FIG. 3 occurs. FIG. 3 shows the final output clock signal OUT when the tap terminal 30A is switched to the other tap terminal 30D at a fall timing in the input clock signal IN before both the output clock signals OUTA and OUTD falls. This final output clock signal OUT contains a hazard or spike occurred on the switching of tap terminals and has a degraded waveform.

However, if the output clock signal OUTD is used as a clock signal for the control circuit 40, such a hazard or spike as shown in FIG. 3 will not occur in the final output clock signal OUT.

Second Embodiment

The final output clock signal OUT shown in FIG. 2 has two successive cycles both of which are equal to 30 ns. When such a final output clock signal OUT is transferred as one-half divided clock signals, the advantage of EMI noise reduction would not be provided.

Figure 4:
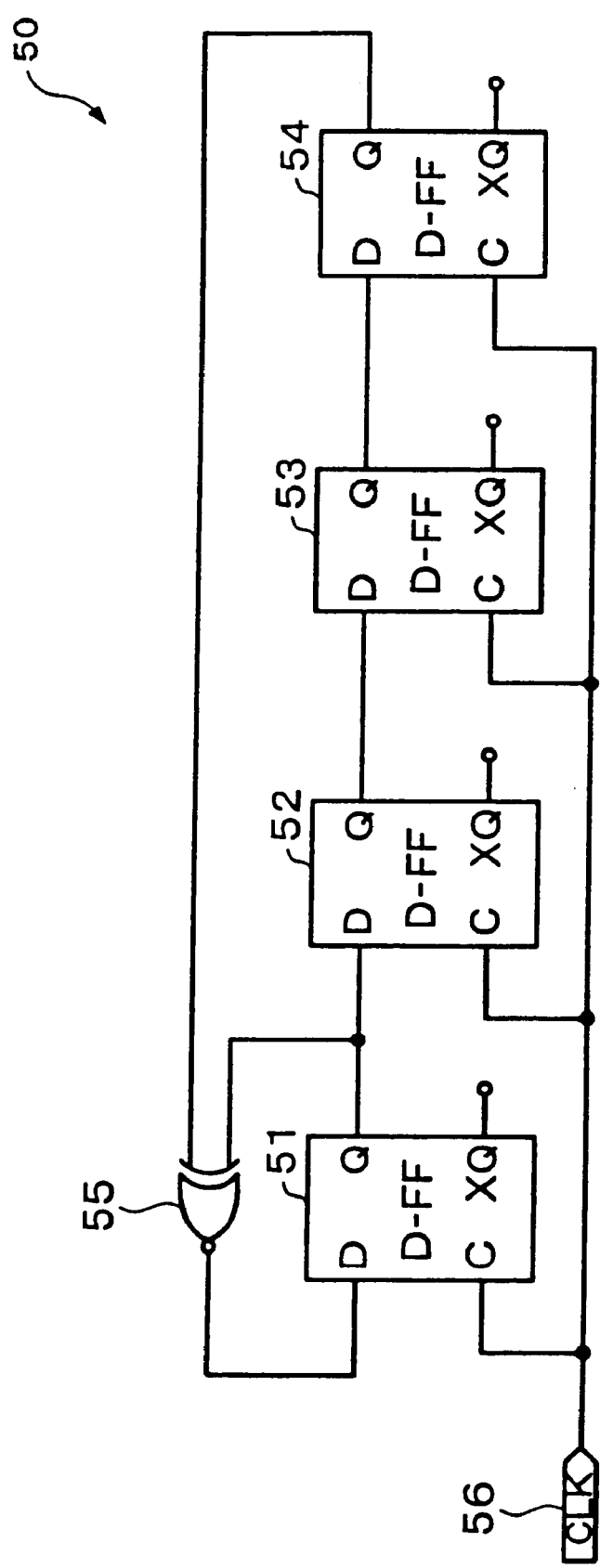
FIG. 4 is a block diagram of a clock generating circuit according to a second embodiment of the present invention in which the control circuit shown in FIG. 1 is replaced by a linear feedback shift register.

To overcome such a problem, the second embodiment of the present invention constructs the control circuit 40 shown in FIG. 1 with a linear feedback shift register (LFSR) 50 shown in FIG. 4. This LFSR 50 comprises a four-bit shift register formed by four D-type flip flops 51 to 54 in which the data terminal D in one flip flop is connected to the non-inverted output terminal Q of another flip flop. The non-inverted output terminals Q of the first and fourth D-type flip flops 51 and 54 are connected to the input terminal of an exclusive NOR circuit 55, the output signal of which is in turn feedback inputted into the first D-type flip flop 51. The C terminal of each of the D-type flip flops 51 to 54 receive a clock signal from a clock input terminal 56 together.

Since the LFSR 50 shown in FIG. 4 is of four-bit configuration, it provides a pseudo-random number-like output circulated with $2^4-1=15$ clocks. When, for example, the lower two bits among the four-bit output is inputted into the selector circuit 30 shown in FIG. 1, one cycle in the final output clock signal OUT from the output terminal 12 of FIG. 1 can be varied in the fashion of pseudo-random number.

As a result, time required by two successive cycles in the final output clock signal OUT will not equal to 30 ns. Even if such a final output clock signal OUT is transferred as one-half divided clock signals, EMI noise may effectively be reduced.

If the selector 30 requires an N-bit signal, the LFSR 50 shown in FIG. 4 may be formed of at least (N+1) bits.

FIG. 1 shows the principle of the present invention in which the tap terminal switching signal inputted into the selector circuit 30 is formed by two bits, this switching signal is in fact formed by more bits. Thus, the number of bits in the LFSR 50 shown in FIG. 4 may be increased for the selector 30, thereby varying one cycle in the final output clock signal OUT further in the fashion of pseudo random number.

Third Embodiment

Figure 5:
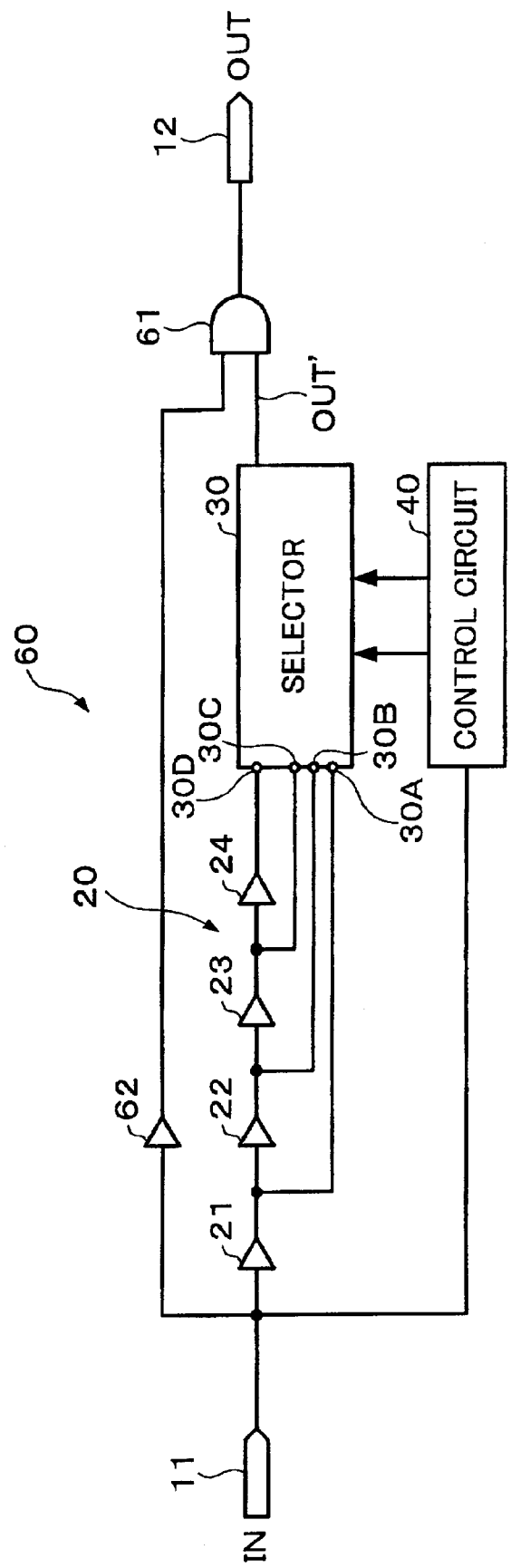
FIG. 5 is a block diagram of a clock generating circuit according to a third embodiment of the present invention, which is designed to avoid such a hazard as shown in FIG. 3.

FIG. 5 shows another clock generating circuit 60 which will not produce such a hazard or spike as shown in FIG. 3. Parts of FIG. 5 having the same functions as those of FIG. 1 are designated by similar reference numerals and will not further be described.

The control circuit 60 shown in FIG. 5 receives an input clock signal IN, rather than the output clock signal OUTD passed through the final-state buffer 24 and buffer 41 as shown in FIG. 1.

At the front stage of the output terminal 12, a logic gate such as AND gate 61 is provided. The AND gate 61 receives the output of the selector 30 and a signal obtained by delaying the input clock signal IN by a buffer 62. The buffer 62 is for adjusting the timing of fall in the final output clock signal OUT and not necessarily required. For convenience, the following description will be made to such an arrangement that the delay time in the buffer 62 is neglected and that the timing of fall in the final output clock signal OUT is coincide with the timing of fall in the input clock signal IN.

Figure 6:
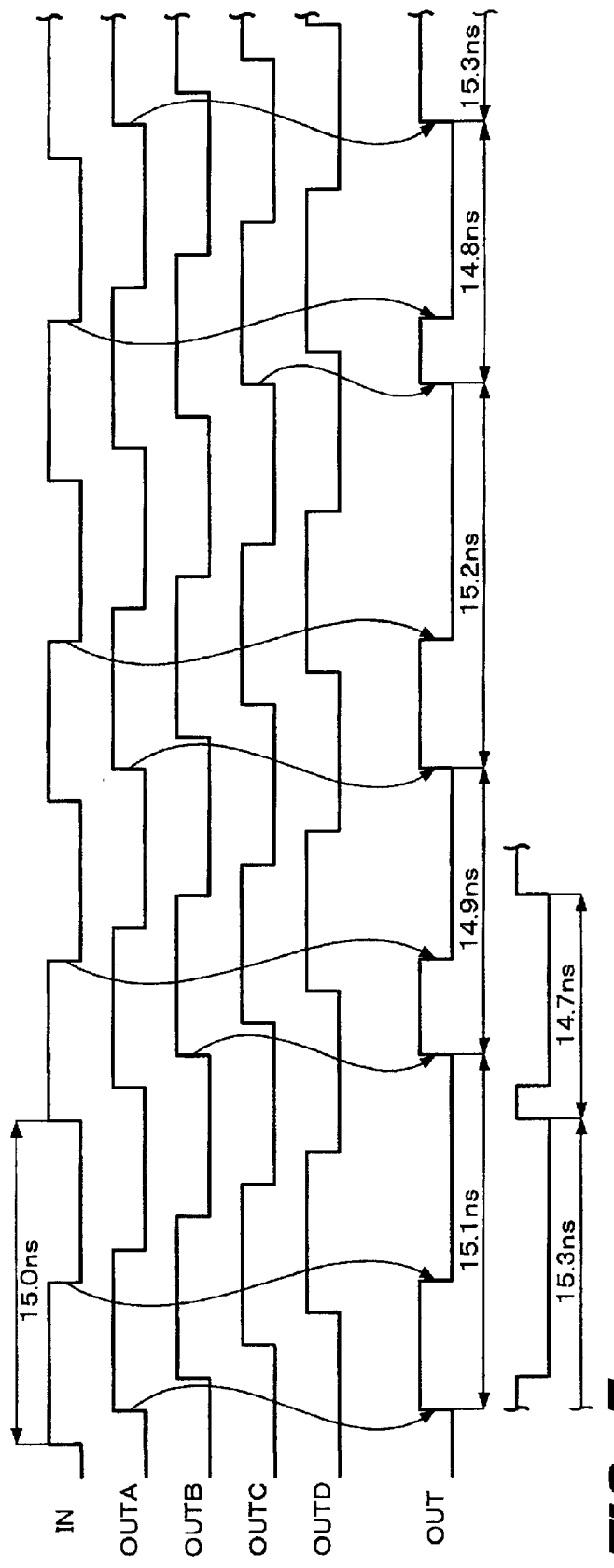
FIG. 6 is a timing chart illustrating the operation of the clock generating circuit shown in FIG. 5.

FIG. 6 shows a timing chart illustrating the operation of the clock generating circuit shown in FIG. 5.

FIG. 6 is different from FIG. 2 only in that each timing of fall in the final output clock signal OUT is coincide with the timing of fall in the input clock signal IN. One cycle in the final output clock signal OUT shown in FIG. 6 also varies through the order of 15.1 ns→14.9 ns→15.2 ns→14.8 ns→15.3 ns→14.7 ns as described. As a result, EMI noise can be reduced even though the clock generating circuit shown in FIG. 5 is used. The control circuit 40 shown in FIG. 5 can be replaced by the LFSR 50 shown in FIG. 4.

The clock generating circuit 60 shown in FIG. 5 directly uses the input clock signal IN as a clock signal to the control circuit 40, rather than the output clock signal OUTD as shown in FIG. 1.

Figure 7:
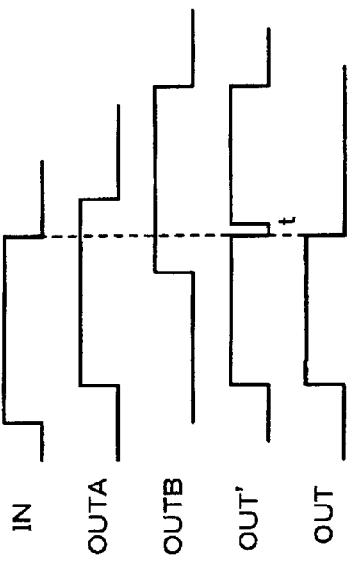
FIG. 7 is a timing chart illustrating the operation of the clock generating circuit shown in FIG. 5 in which no hazard occurs in the final output signal.

As shown in FIG. 7, thus, the hazard or spike similar to that of FIG. 3 will occur in the output OUT from the selector 30 when the selection is switched between the tap terminals 30A to 30D shown in FIG. 5 at the timing of fall in the input clock signal IN. However, if the AND gate 61 takes the logical product between the output OUT' from the selector 30 and the input clock signal IN, no hazard or spike will be present in the final output clock signal OUT.

Accordingly, the clock generating circuit 60 shown in FIG. 5 has an advantage in that a hazard or the like will be prevented from occurring at the final output clock signal OUT even though using the input clock signal IN as a clock signal to the control circuit 40.

Fourth Embodiment

Figure 8:
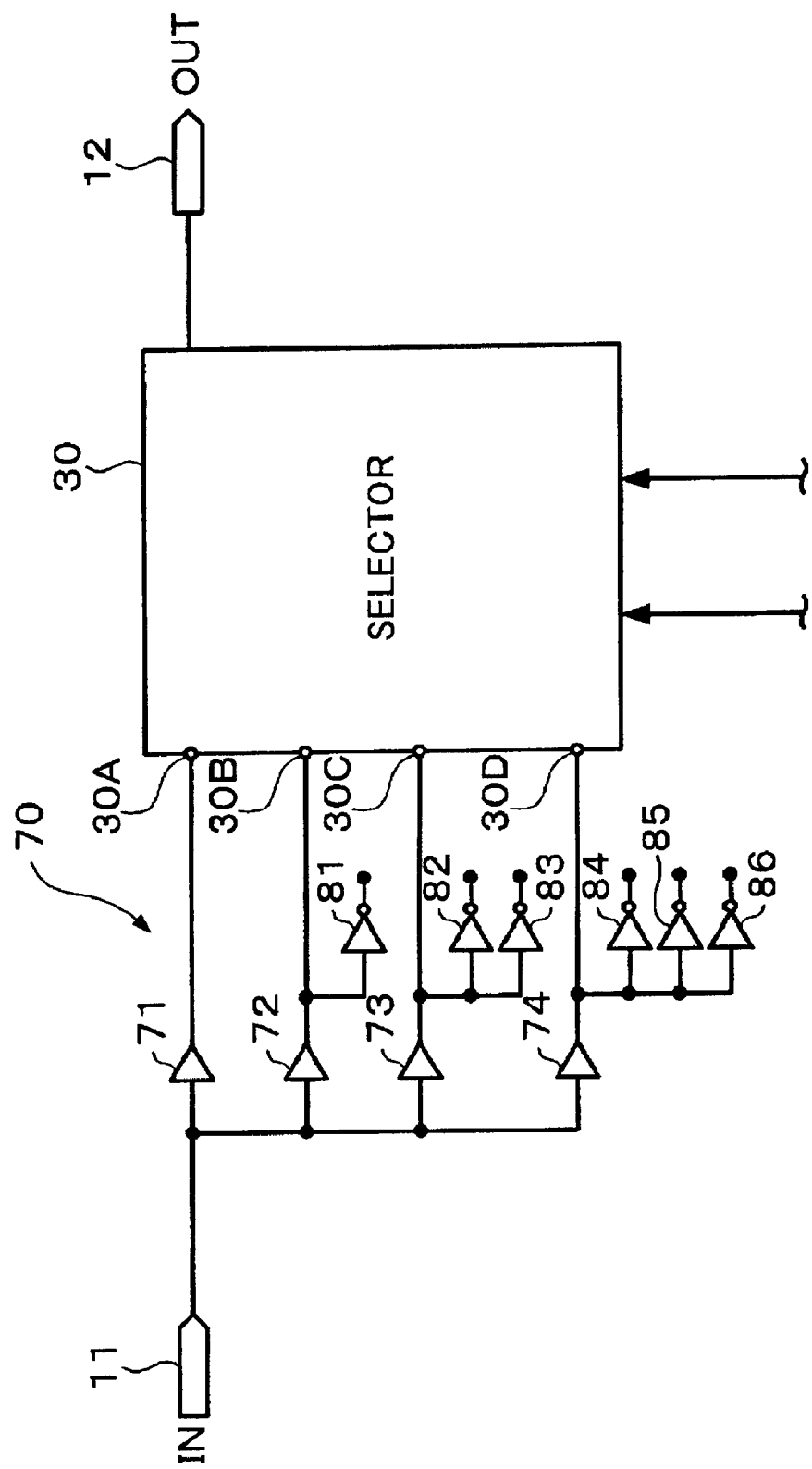
FIG. 8 is a block diagram of a clock generating circuit according to a fourth embodiment of the present invention.

FIG. 8 shows a delay circuit different from the delay circuits 20 shown in FIGS. 1 and 5. This delay circuit 70 includes buffers 71 to 74 which are connected parallel between the input terminal 11 and the selector 30. The output side of each of the buffers 72 to 74 is connected to the different number of inverters such as inverters 81 to 86. Thus, the fan-outs of the buffers 71 to 74 can be set to be different from one another.

The delay time in each of the buffers 71 to 74 is, for example, 0.1 ns (100 ps) which is the minimum delay time settable by a single buffer, as in the buffers 21 to 24 shown in FIGS. 1 and 5. On the other hand, the delay time can slightly be increased, for example, by 20 ps by connecting a signal inverter to these buffers as a load.

Therefore, the delay time of a clock signal inputted into the tap terminal 30A shown in FIG. 8 is 100 ps at the buffer 71 while the delay times in the clock signals inputted into the tap terminals 30B to 30D are 120 ps, 140 ps and 160 ps, respectively.

In the clock generating circuits 10 and 60 shown in FIGS. 1 and 5, one cycle in the resulting final output clock signal OUT can only be varied by the minimum unit corresponding to the delay time for such a single buffer (for example, 100 ps).

However, if the delay circuit 70 shown in FIG. 8 is used, one cycle in the resulting final output clock signal OUT can be varied by the minimum unit corresponding to the delay time for this single buffer (for example, 20 ps).

Fifth Embodiment

Figure 9:
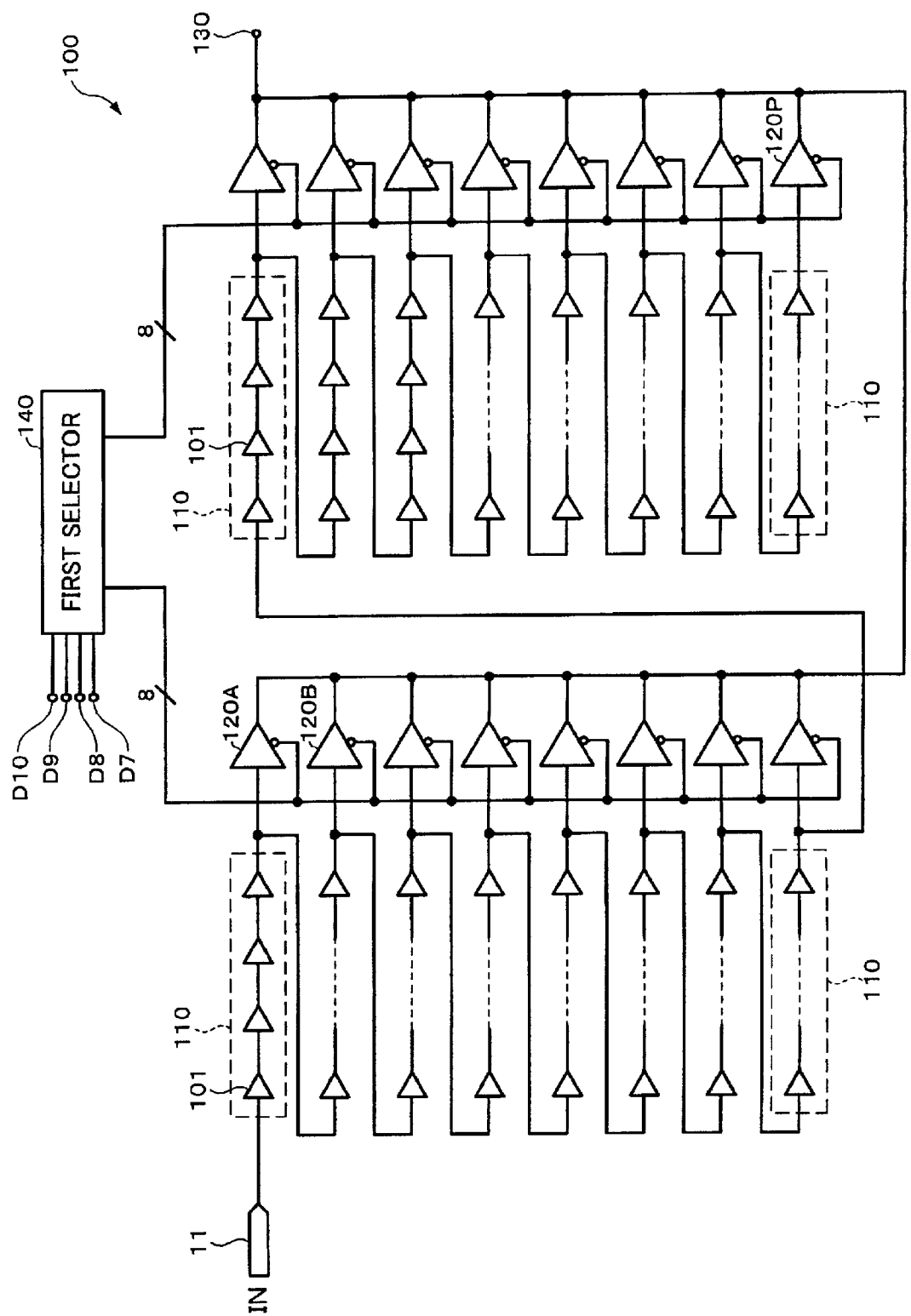
FIG. 9 is a circuit diagram of a first-stage delay circuit in a clock generating circuit according to a fifth embodiment of the present invention.
Figure 10:
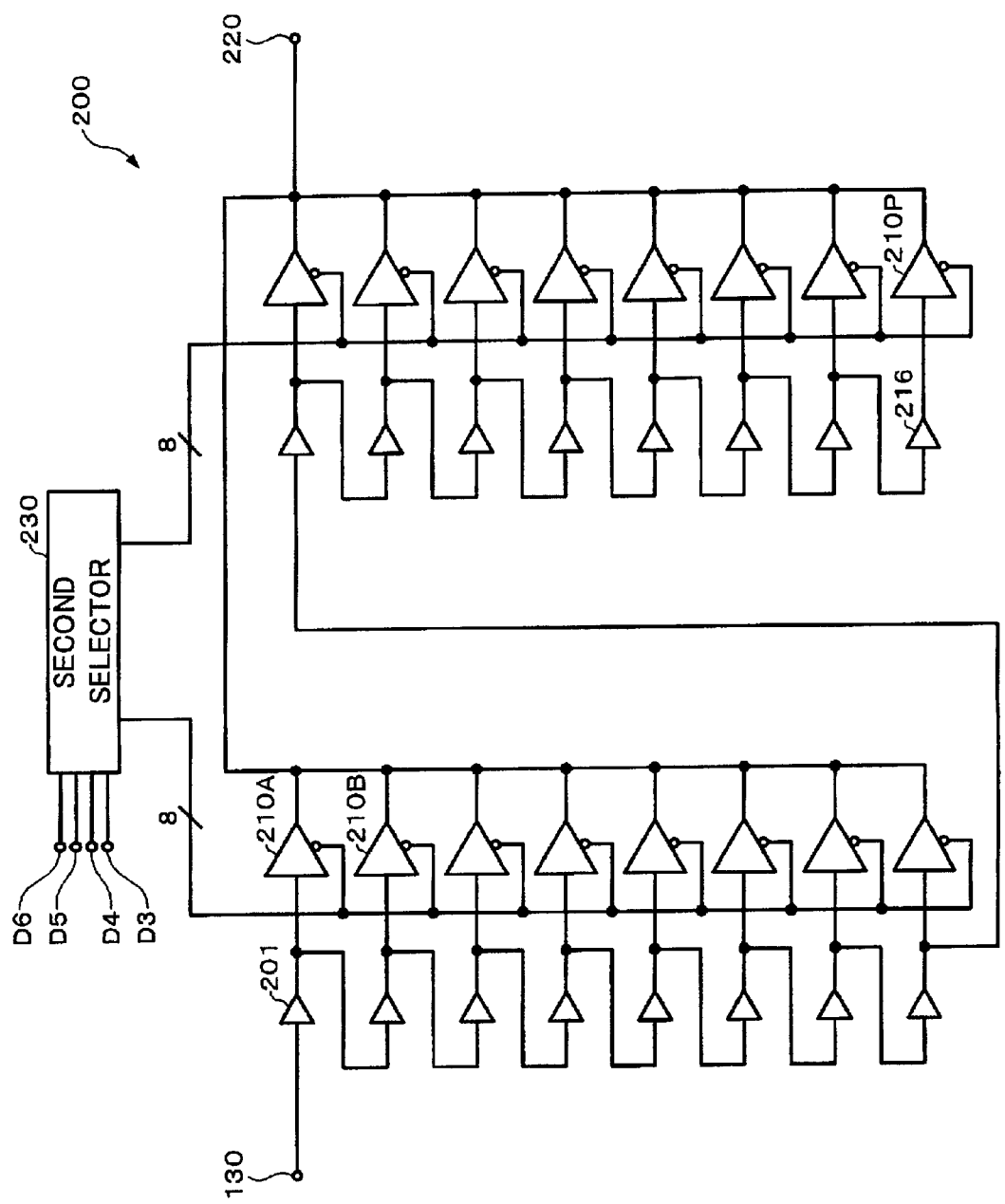
FIG. 10 is a circuit diagram of a second-stage delay circuit in the clock generating circuit according to the fifth embodiment of the present invention.
Figure 11:
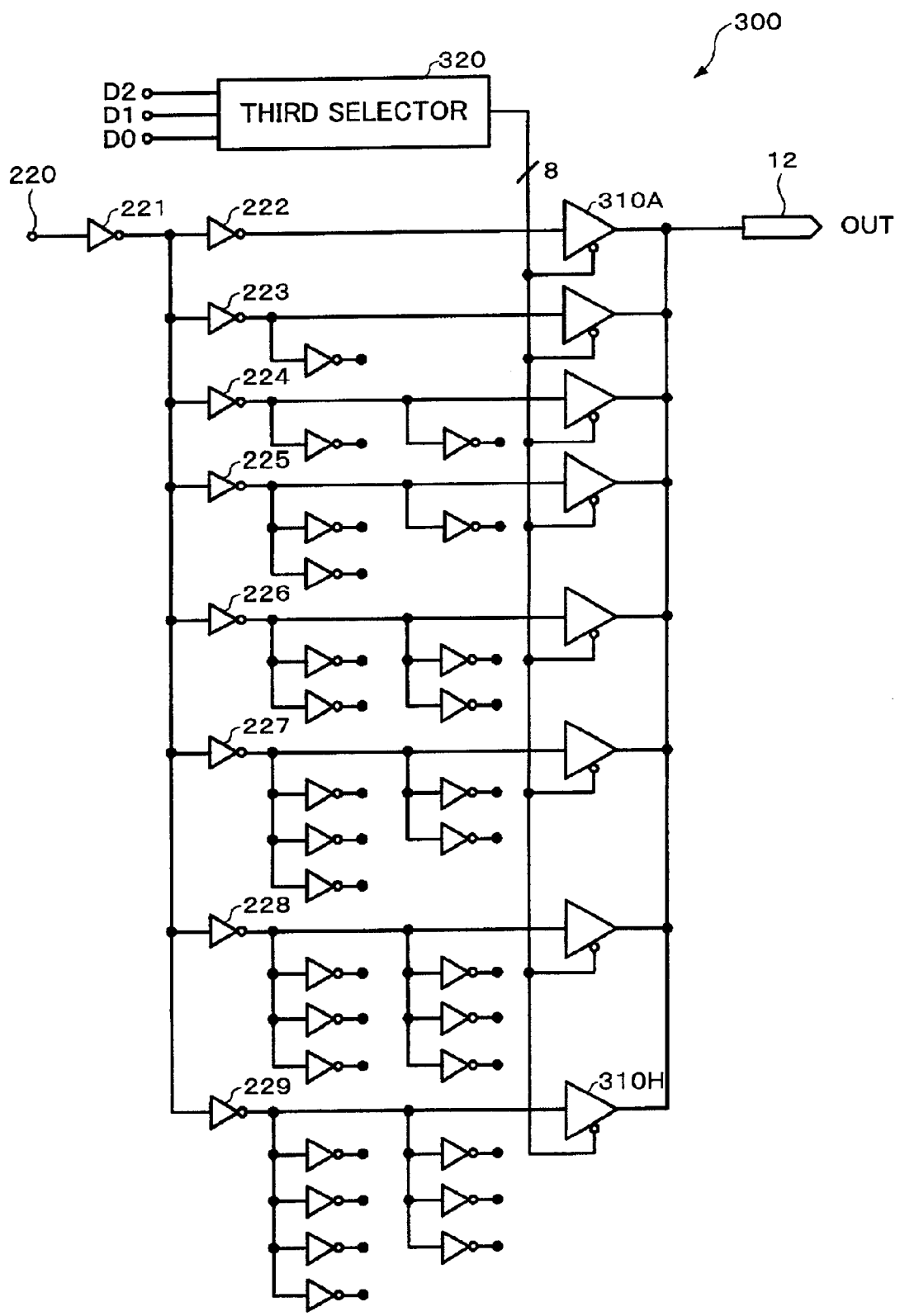
FIG. 11 is a circuit diagram of a third-stage delay circuit in the clock generating circuit according to the fifth embodiment of the present invention.

FIGS. 9 to 11 show an example of a delay circuit and a selector, which are used in the actual circuit. The delay circuit of the clock generating circuit according to the fifth embodiment of the present invention comprises a first-stage (or primary state) delay circuit 100 shown in FIG. 9, a second-stage (or middle-stage) delay circuit 200 shown in FIG. 10 and a third-stage (or final) delay circuit 300 shown in FIG. 11.

The first-stage delay circuit 100 shown in FIG. 9 comprises several sets of delay blocks 110, 16 sets for example, which are connected in series, each of which blocks comprises buffers 101 connected in series.

The output of each of the delay blocks 110 is connected in common to the output terminal 130 of the delay circuit 100 through the corresponding 3-state buffer 120 (120A to 120P). One of these sixteen three-state buffers 120 is selected by a first selector 140, for example, based on upper four bits D7 to D10 out of 11 switching signal bits D0 to D10.

If it is assumed herein that the delay time in one delay block 110 is Tpd1, the input clock signal IN is delayed by 2×Tpd1 when only the three-state buffer 120B shown in FIG. 9 is turned on. The minimum delay time realized by this delay circuit 100 is equal to the delay time Tpd1 when the three-state buffer 120A is turned on while the maximum delay time is equal to the delay time (16×Tpd1) when the three-state buffer 120P is turned on.

The middle-stage delay circuit 200 shown in FIG. 10 comprises sixteen buffers 201 to 216, for example, connected in series. The output of each of the buffers 201 to 216 is connected in common to the output terminal 220 of the delay circuit 200 through the respective one of three-state buffers 210 (210A to 210P). One of these sixteen three-state buffers 210 is selected by a second selector 230 based on middle four bits D3 to D6 out of 11 switching signal bits D0 to D10, for example.

If it is assumed herein that the delay time in each buffer 201 is Tpd2 (Tpd2<Tpd1), the input clock signal IN is delayed by 2×Tpd2 when only the three-state buffer 210B shown in FIG. 10 is turned on. The minimum delay time realized by this delay circuit 120 is equal to the delay time Tpd2 when the three-state buffer 210A is turned on while the maximum delay time is equal to the delay time (16×Tpd2) when the three-state buffer 210P is turned on. Furthermore, the maximum delay time (16×Tpd2) in the delay circuit 200 is set to be substantially equal to the minimum delay time Tpd1 in the delay circuit 100 shown in FIG. 9.

The final-stage delay circuit 300 shown in FIG. 11 has the same configuration as that of the delay circuit 70 shown in FIG. 8. The final-stage delay circuit 300 shown in FIG. 11 comprises a logically matching inverter 221 connected to the terminal 220 thereof. Inverters 222 to 229 are connected parallel between the inverter 221 and the output terminal 12. Seven inverters 223 to 229 other than the inverter 222 are connected to loading inverters different in number from one another. For example, one of these inverters 223 is connected to a single loading inverter while the other inverters 223 to 229 are respectively connected to two through seven loading inverters. The output stage of each of the inverters, which is connected to each of eight lines, is connected to the respective one of three-state buffers 310 (310A to 310H).

One of these eight three-state buffers 310 is selected by a third selector 320 based on lower three bits D0 to D3 in 11 switching signal bits D0 to D10, for example.

If it is assumed herein that the increment in the delay time when a single loading inverter is connected to each line is Δtp and that the delay time in the inverter 221 and any inverter connected to the middle of each line (either of the inverters 222 to 229) is a constant equal to tpd0, the delay time when n number of the loading inverters are connected to each line becomes equal to (tpd0+Δtp).

The minimum delay time realized by this delay circuit 300 is the constant delay time obtained at two inverters 221 and 222 when the three-state buffer 310A is turned on. The maximum delay time is prolonged by 7×Δtp when the three-state buffer 310H is turned on, since the inverter 229 is connected to seven inverters. In the general CMOS process, the increment in the delay time when the number of inverters is increased by one is equal to about 20 ps.

Furthermore, the maximum delay time in the delay circuit 300 is set to be substantially equal to the minimum delay time in the delay circuit 200 shown in FIG. 10.

In such a manner, by switching the first to third delay circuits 100 to 300 according to the logic, for example, in a 11-bit signal (D0 to D11), the delay time may be obtained, for example, with the resolution of 20 ps, thereby varying one cycle in the final output clock signal OUT obtained by the output terminal 12 to any of various values.

Sixth Embodiment

Figure 12:
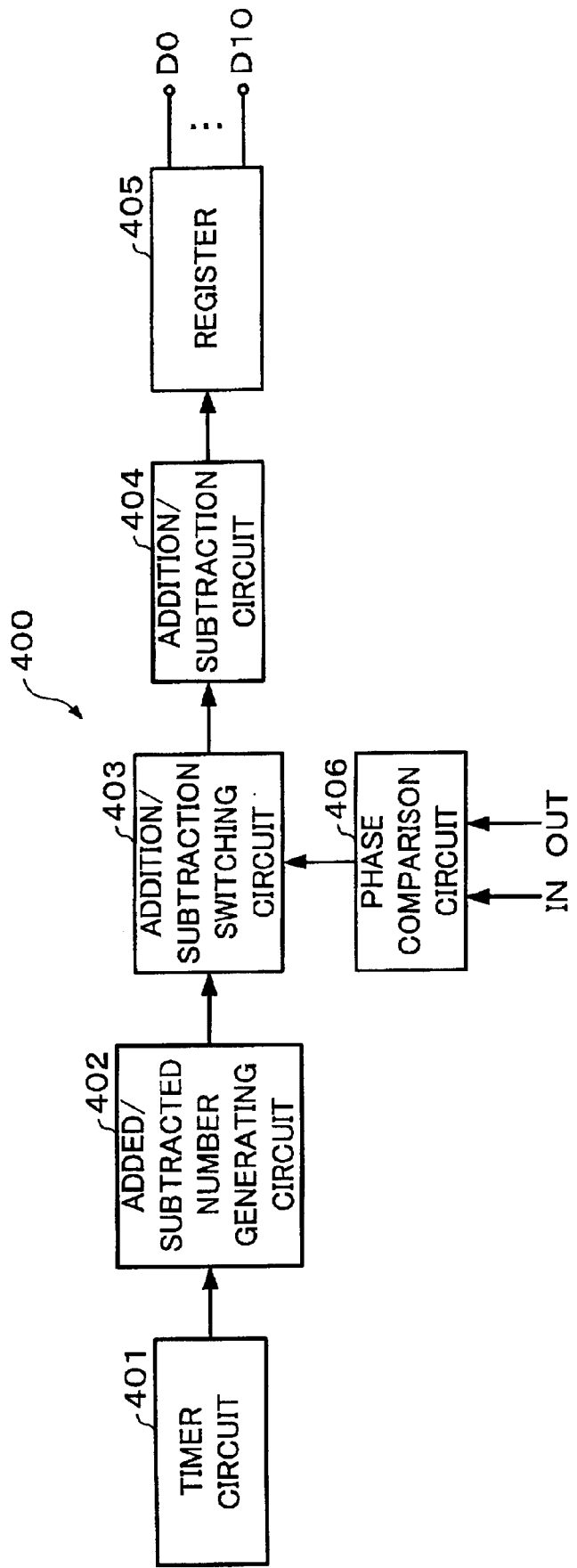
FIG. 12 is a block diagram of a control circuit used in a sixth embodiment of the present invention.

FIG. 12 shows a control circuit 400 for generating control signal of 11 bits D0 to D10 supplied to the first to third selectors 140, 230 and 320 which control the delay circuits 100, 200 and 300 shown in FIGS. 9 to 11, respectively.

Figure 13:
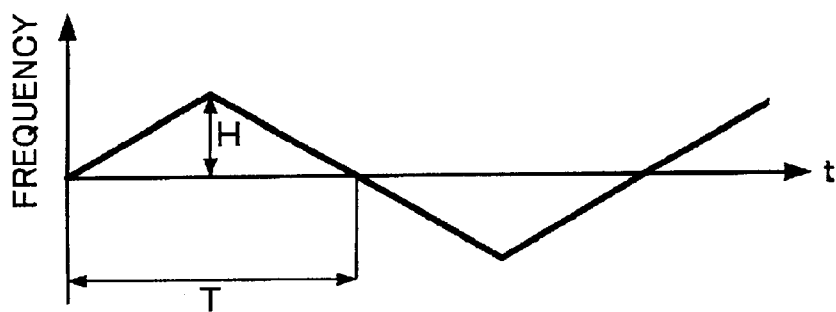
FIG. 13 is a characteristic diagram illustrating an example of a signal which has its variable cycle set by the timer circuit shown in FIG. 12.
Figure 14:
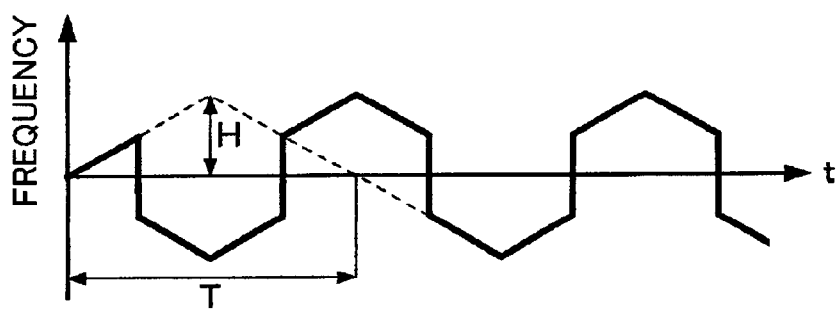
FIG. 14 a characteristic diagram illustrating another example of a signal which has its variable cycle set by the timer circuit shown in FIG. 12.

The control circuit 400 outputs the control signal bits D0 to D10 so that the frequency of the final output clock signal OUT from the output terminal 11 of FIG. 11 maybe varied according to such a characteristic as schematically shown in FIG. 13 or 14.

In FIG. 13, the frequency of the final output clock signal OUT gradually increases or decreases. To increase the frequency of the final output clock signal OUT, the delay time at each of the delay circuits 100, 200 and 300 shown in FIGS. 9 to 11 may suitably be selected to shorten its cycle. On the contrary, to decrease the frequency of the final output clock signal OUT, the delay time at each of the delay circuits 100, 200 and 300 shown in FIGS. 9 to 11 may suitably be selected to prolong its cycle. However, the sixth embodiment is not limited to such a configuration that the frequency of the final output clock signal OUT is continuously increased or decreased as shown in FIG. 13. With the clock generating circuit 10 shown in FIG. 1, for example, it is preferred that the frequency of the final output clock signal OUT is varied while repeating the setting of the delay time having its variable cycle through times so that one cycle in the final output clock signal OUT will repeatedly be set at the same delay time as can be represented by 15.1 ns→15.1 ns→ . . . 15.1 ns, for example.

When the frequency of the final output clock signal OUT was gradually varied while selecting the same frequency for clock signals, the reduction of EMI noise was confirmed by use of the conventional spectrum analyzer which is used for measuring EMI. Although such a spectrum analyzer cannot respond to rapid change of the frequency, it is explained in the foregoing that EMI noise can be reduced even though one cycle in the final output clock signal OUT is variable as described in connected with the first embodiment.

FIG. 12 also shows a timer circuit 401 which is to variably set the time of one cycle with the frequency being varied as shown in FIG. 13 or 14. An added/subtracted number generating circuit 402 generates a delay time ΔTpd to be added to or subtracted from the previously set delay time Tpd. The number of addition/subtraction operations is restricted. If it is therefore assumed that the number of addition/subtraction operations is equal to N, the amplitude H shown in FIG. 13 becomes equal to N×ΔTpd. Therefore, the added/subtracted number generating circuit 402 has a function of controlling the amplitude H shown in FIG. 13.

An addition/subtraction switching circuit 403 supplies the delay time ΔTpd generated by the added/subtracted number generating circuit 402 to an addition/subtraction circuit 404 located at next stage and for controlling whether the delay time ΔTpd is to be added to or subtracted from the delay time Tpd previously set by the addition/subtraction circuit 404.

The addition/subtraction circuit 404 may be formed of an up-counter or the like and performs the above-mentioned operation of Tpd±ΔTpd. Based on the output of the addition/subtraction circuit 404, a register 405 outputs control signal of 11 bits D0 to D10 which are in turn inputted into the first to third selectors 140, 230 and 320 shown in FIGS. 9 to 11. Thus, one cycle in the final output clock signal OUT is varied by Tpd±ΔTpd to vary the frequency of the final output clock signal OUT.

FIG. 12 further shows a phase comparison circuit 406, the output of which can be used to switch the addition/subtraction operation in the addition/subtraction circuit 404 through the addition/subtraction switching circuit 403. This switching enables the characteristic shown in FIG. 14 to be provided.

The operation in the phase comparison circuit 406 shown in FIG. 12 will be described with respect to FIG. 15. In this figure, it is assumed that time required to maintain the input clock signal IN at high-level is Ton. In addition to the input clock signal IN, FIG. 15 shows an output clock signal OUTA delaying the input clock signal IN by the minimum delay time α and another output clock signal OUTX delaying the input clock signal IN by a delay time (Ton+α).

The phase comparison circuit 406 monitors any phase shift in the final output clock signal OUT relative to the input clock signal IN. Thus, the phase comparison circuit 406 switches the presently continuing addition to the subtraction or vice versa before the phase shift relative to the input clock signal IN becomes equal to or higher than (Ton+α) as in the output clock signal OUTX of FIG. 15. The resulting frequency in the final output clock signal OUT varies according to such a characteristic as shown in FIG. 14.

Figure 15:
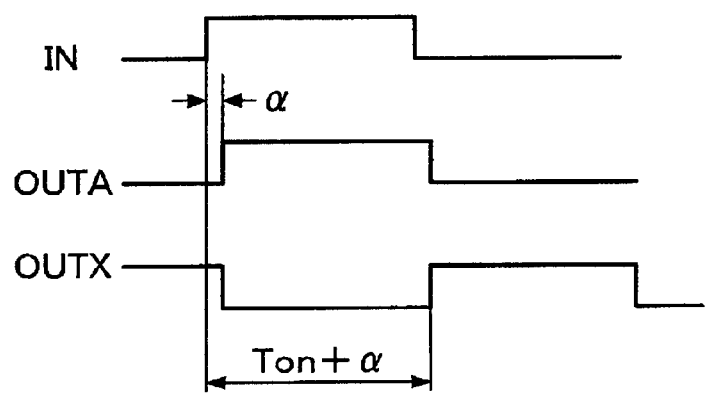
FIG. 15 is a timing chart illustrating the operation of a phase comparison circuit shown in FIG. 12.

The switching for the addition/subtraction at the timing shown in FIG. 15 is performed because any memory such as FIFO or the like must be added to the logic circuit to handle a clock signal having its phase shift exceeding the high-level time Ton of the input clock signal IN as in the output clock signal OUTX of FIG. 15.

Seventh Embodiment

Figure 16:
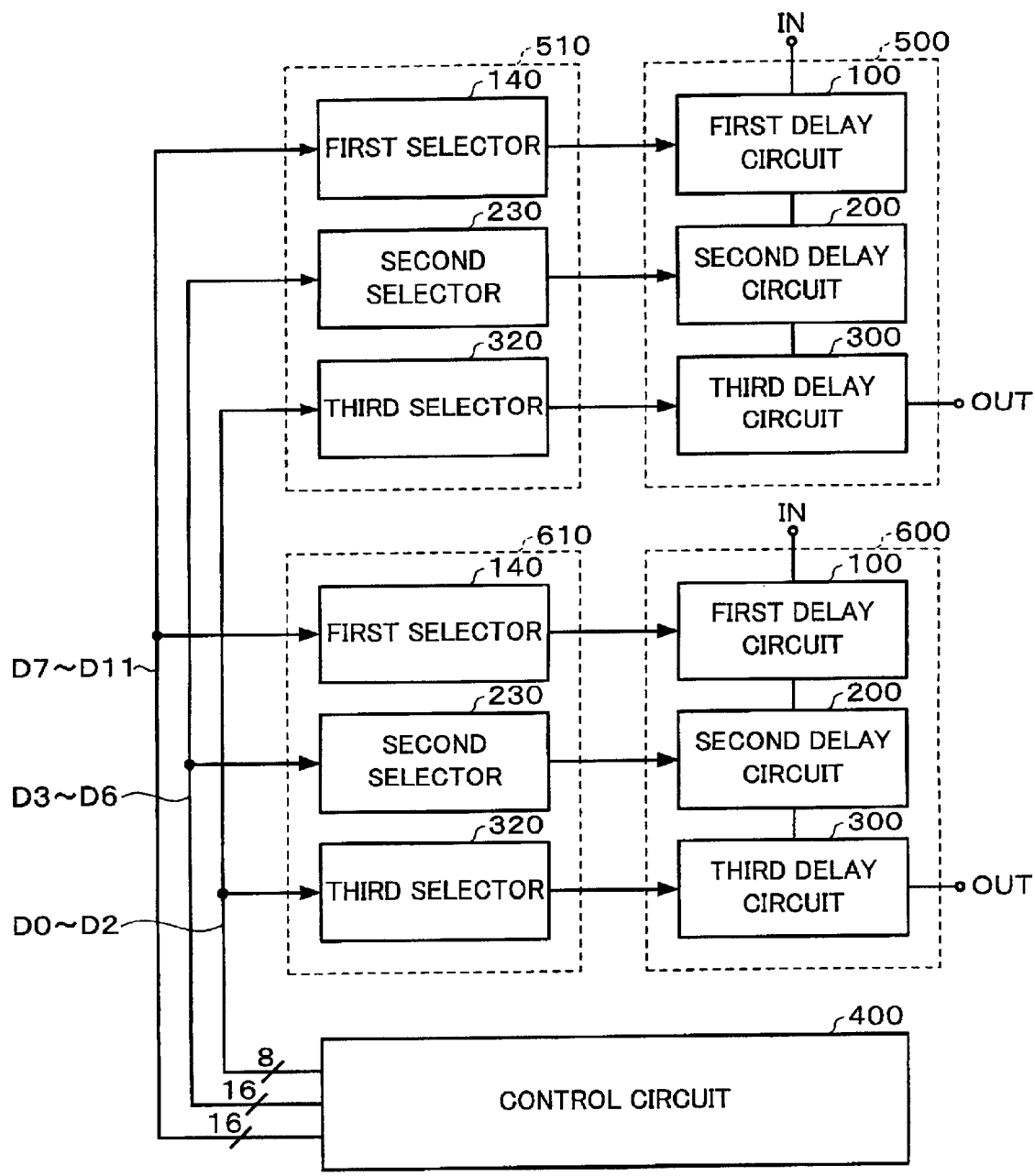
FIG. 16 is a block diagram of a clock generating circuit according to a seventh embodiment of the present invention.

In the seventh embodiment, a clock generating circuit comprises a single control circuit 400, a plurality (for example, two) of delay circuits 500 and 600 and a plurality (for example, two) of selectors 510 and 610, as shown in FIG. 16. One of the selectors 510 selects the delay time for the delay circuit 500 while the other selector 610 selects the delay time for the delay circuit 600. Each of the delay circuits 500 and 600 comprises first to third delay circuits 100, 200 and 300 as shown in FIGS. 9 to 11. Each of the selectors 510 and 610 also comprises first to third selectors 140, 230 and 320 as shown in FIGS. 9 to 11.

In the seventh embodiment, the single control circuit 400 is shared by the two selectors 510 and 610.

The necessity of providing the two delay circuits 500 and 600 is because two clocks that vary without changing the phase difference are used when this spread spectrum circuit is applied to a logic circuit in a semiconductor integrated circuit. For example, if an internal circuit is operating with two clocks having the phase difference of ¼ cycle, it is required that the modulation is performed while maintaining the phase difference between the two clocks.

Eighth Embodiment

Figure 17:
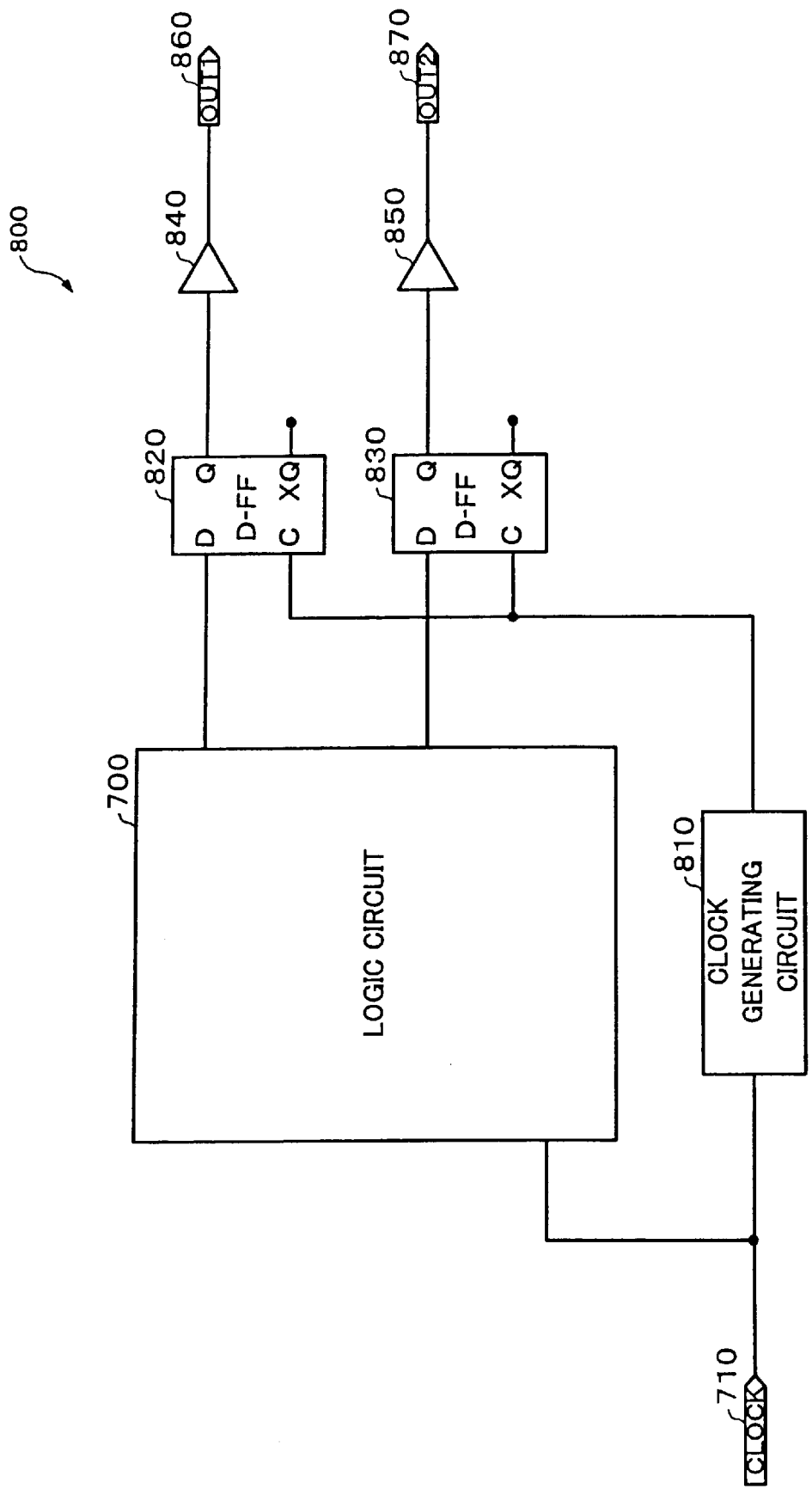
FIG. 17 is a circuit diagram of a semiconductor integrated circuit according to an eighth embodiment of the present invention.
Figure 18:
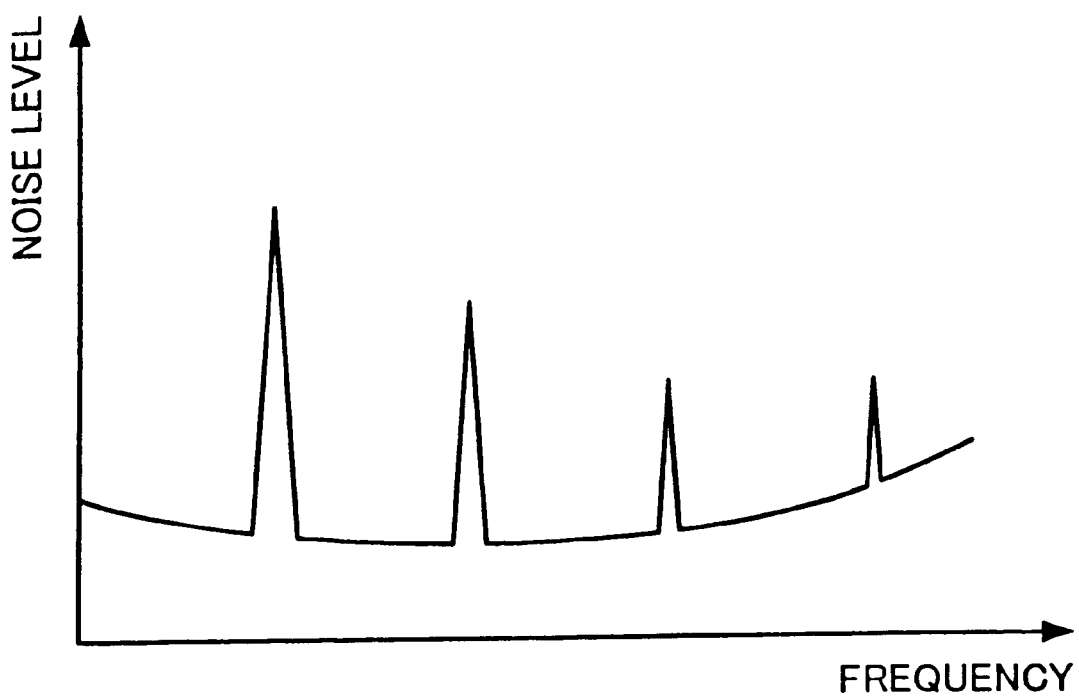
FIG. 18 is a characteristic diagram illustrating EMI noise in a conventional electronic instrument.

The eighth embodiment of the present invention provides a circuit comprising a semiconductor integrated circuit which includes the aforementioned clock generating circuit, as shown in FIG. 17.

A logic circuit 700 included in the semiconductor integrated circuit operates based on a reference clock signal which is inputted through a clock input terminal 710. The semiconductor integrated circuit also includes an output circuit 800 through which the signal from the logic circuit 700 is outputted. A clock generating circuit 810, which is of any configuration among the aforementioned configurations, generates a clock for the output circuit 800.

Thus, the reference clock signal is inputted from the clock input terminal 710 into the clock generating circuit 810 in which clock signals having different cycles are generated.

For example, the output circuit 800 comprises two D-type flip-flops 820 and 830, two buffers 840 and 850 to which signals from the output terminals Q of the flip flops are inputted, and output terminals 860 and 870 to which the output of the buffers 840 and 850 are supplied.

The clock signal from the clock generating circuit 810 is supplied to the clock input terminals C of the two D-type flip flops 820 and 830.

In such an arrangement, the clock signal from the clock generating circuit 810 functions as a transfer clock signal used to transfer the output signals from the two D-type flip flops 820 and 830. Since the frequency of the transfer clock signal is variable, EMI noise due to the signal transmitted through the wiring of the printed circuit board through the output terminals 860 and 870 can be reduced.

The clock signal from the clock generating circuit according to the present invention is not limited to the transfer clock signal used in the output circuit of the semiconductor integrated circuit, but may also be used as a reference clock within the semiconductor integrated circuit. For example, the clock signal can be used as an operational clock signal if it can be used within a range of operational margin relative to the clock signal.

What is claimed is:

1. A clock generating circuit comprising:

a delay circuit having output terminals, the delay circuit delaying an input clock signal and outputting delayed clock signals of different delay times respectively;

a selector selecting one of the output terminals; and a control circuit controlling a selection operation in the selector, wherein the control circuit supplies a group of bit output signals circulated in a predetermined cycle to the selector, and wherein a frequency of an output clock signal is sequentially outputted from each of the output terminals selected by the selector, the frequency increases or decreases in accordance with the group of the bit output signals.

2. The clock generating circuit according to claim 1, wherein the control circuit includes a counter circuit counting a given signal and supplies a bit output signal to the selector, the bit output signal selecting one of the output terminals that increases or decreases the delay time based on a count value from the counter circuit.

3. The clock generating circuit according to claim 2, wherein the selector alternately selects one of the output terminals providing minimum delay time and another of the output terminals based on the bit output signal.

4. The clock generating circuit according to claim 2, wherein the counter circuit counts one of the output clock signals having maximum delay time among the output clock signals outputted through the output terminals.

5. The clock generating circuit according to claim 1, wherein the control circuit includes a linear feedback shift register having a bit output at least (N+1) where N is a number of bits in the bit output signal supplied to the selector, an output signal of N bits being supplied from the linear feedback shift register to the selector.

6. The clock generating circuit according to claim 2, further comprising a logic gate into which a delayed clock signal from the one of the output terminals selected by the selector and the input clock signal are inputted to generate an output clock signal having an edge of which position is equal to a position of an edge of the input clock signal.

7. The clock generating circuit according to claim 6, wherein the counter circuit counts the input clock signal.

8. The clock generating circuit according to claim 1, wherein a buffer is connected to each of front stage of the output terminals of the delay circuit and each buffer is connected to a load different from another.

9. The clock generating circuit according to claim 1, wherein the delay circuit comprises first and second delay circuits connected in series, wherein the first delay circuit has first output terminals each of which outputs a first clock signal being delayed by a multiple of a first predetermined delay time, wherein the second delay circuit has second output terminals, the second delay circuit further delaying the first clock signal outputted from any one of the first output terminals in the first delay circuit by a multiple of a second predetermined delay time and outputting a second clock signal from the second output terminals, and wherein the second delay time is shorter than the first delay time.

10. The clock generating circuit according to claim 9, wherein M (M≧2) number of buffers are connected in series to a front stage of each of the first output terminals in the first delay circuit, and wherein at least one of buffers equal to or less than (M−1) number is connected to a front stage of each of the second output terminals in the second delay circuit.

11. The clock generating circuit according to claim 10, further comprising a third delay circuit which is connected in series to the second delay circuit, wherein the third delay circuit has third output terminals, each of which further delays the second clock signal outputted from any one of the second output terminals in the second delay circuit by a different delay time that is a multiple of a third predetermined delay time shorter than the second predetermined delay time, and outputs a third clock signal.

12. The clock generating circuit according to claim 11, wherein each front stage of the third output terminals is connected to a load different from another.

13. The clock generating circuit according to claim 1, wherein the control circuit comprises a timer circuit which sets a cycle of frequency in the output clock signal until the output clock signal gradually increases and decreases.

14. The clock generating circuit according to claim 13, wherein the control circuit comprises:

an addition/subtraction circuit obtaining a bit output signal which gradually increases or decreases a frequency of the output clock signal; and an addition/subtraction switching circuit switching between addition and subtraction in the addition/subtraction circuit.

15. The clock generating circuit according to claim 14, further comprising a phase comparison circuit which compares a phases difference between the input clock signal and the output clock signal, the phase comparison circuit outputting a switching signal to the addition/subtraction circuit when the phase difference exceeds a specified value.

16. A semiconductor integrated circuit comprising:

a delay circuit having output terminals, the delay circuit delaying an input clock signal and outputting delayed clock signals of different delay times respectively;

a selector selecting one of the output terminals;

a control circuit controlling a selection operation in the selector, wherein the control circuit supplies a group of bit output signals circulated in a predetermined cycle to the selector, and wherein a frequency of an output clock signal is sequentially outputted from each of the output terminals selected by the selector, the frequency increases or decreases in accordance with the group of the bit output signals;

a logic circuit; and an output circuit that outputs a signal from the logic circuit to outside.

17. The semiconductor integrated circuit according to claim 16, wherein the output clock signal from the clock generating circuit is used as a transfer clock signal for the output circuit.

* * * * *